United States Patent
Gardner et al.

(10) Patent No.: US 8,307,674 B2
(45) Date of Patent: Nov. 13, 2012

(54) HOT-MELT SEALING GLASS COMPOSITIONS AND METHODS OF MAKING AND USING THE SAME

(75) Inventors: Robert D. Gardner, Temecula, CA (US); Keith M. Mason, Fallbrook, CA (US); Srinivasan Sridharan, Strongsville, OH (US); Aziz S. Shaikh, San Diego, CA (US)

(73) Assignee: Ferro Corporation, Cleveland, OH (US)

( * ) Notice: Subject to any disclaimer, the term of this patent is extended or adjusted under 35 U.S.C. 154(b) by 353 days.

(21) Appl. No.: 12/532,424

(22) PCT Filed: Jul. 15, 2009

(86) PCT No.: PCT/US2009/050665
§ 371 (c)(1),
(2), (4) Date: Dec. 8, 2009

(87) PCT Pub. No.: WO2010/009213
PCT Pub. Date: Jan. 21, 2010

(65) Prior Publication Data
US 2011/0169108 A1    Jul. 14, 2011

Related U.S. Application Data

(60) Provisional application No. 61/081,051, filed on Jul. 16, 2008.

(51) Int. Cl.
*C03C 27/00* (2006.01)
(52) U.S. Cl. .................. 65/43; 501/15; 257/E21.499
(58) Field of Classification Search ........ 65/43; 501/15; 257/E21.499
See application file for complete search history.

(56) References Cited

U.S. PATENT DOCUMENTS

| | | | |
|---|---|---|---|
| 3,839,540 A * | 10/1974 | Arrol | 423/344 |
| 3,975,201 A * | 8/1976 | Greenstein | 524/314 |
| 4,704,370 A | 11/1987 | Seki et al. | |
| 5,032,158 A | 7/1991 | Kawasaki et al. | |
| 5,122,484 A * | 6/1992 | Beall et al. | 501/46 |
| 5,179,047 A | 1/1993 | Chiba | |
| 6,368,696 B1 * | 4/2002 | Asahi et al. | 428/195.1 |
| 6,989,340 B2 | 1/2006 | Masuda | |
| 2002/0106862 A1 * | 8/2002 | Jordan et al. | 438/406 |
| 2009/0001537 A1 * | 1/2009 | Summers | 257/682 |

OTHER PUBLICATIONS

International Search Report for corresponding PCT/IS2009/050665 mailed Sep. 1, 2009, two pages.

* cited by examiner

*Primary Examiner* — Queenie Dehghan
(74) *Attorney, Agent, or Firm* — Rankin, Hill & Clark LLP

(57) ABSTRACT

Hot-melt sealing glass compositions that include one or more glass frits dispersed in a polymeric binder system. The polymeric binder system is a solid at room temperature, but melts at a temperature of from about 35° C. to about 90° C., thereby forming a flowable liquid dispersion that can be applied to a substrate (e.g., a cap wafer and/or a device wafer of a MEMS device) by screen printing. Hot-melt sealing glass compositions according to the invention rapidly re-solidify and adhere to the substrate after being deposited by screen printing. Thus, they do not tend to spread out as much as conventional solvent-based glass frit bonding pastes after screen printing. And, because hot-melt sealing glass compositions according to the invention are not solvent-based systems, they do not need to be force dried after deposition.

19 Claims, 1 Drawing Sheet

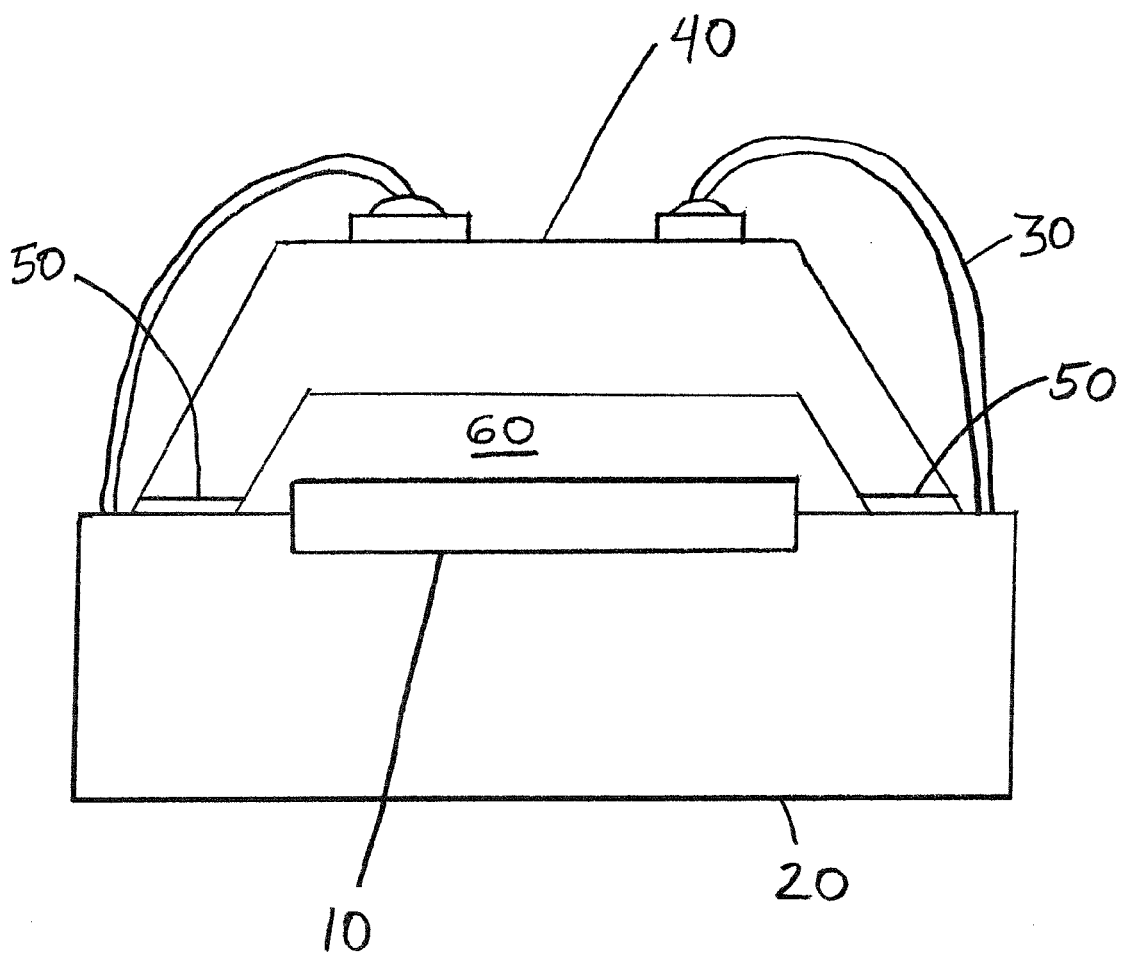

US 8,307,674 B2

HOT-MELT SEALING GLASS COMPOSITIONS AND METHODS OF MAKING AND USING THE SAME

CROSS-REFERENCE TO RELATED APPLICATIONS

The present application claims benefit from U.S. Provisional Patent Application Ser. No. 61/081,051 filed 16 Jul. 2008, which is incorporated herein by reference.

BACKGROUND OF INVENTION

1. Field of Invention

The present invention relates to hot-melt sealing glass compositions and methods of making and using the same.

2. Description of Related Art

FIG. 1 shows a schematic cross-section view of an exemplary microelectromechanical systems ("MEMS") device 10 formed in or on a device wafer 20 made of silicon or glass. The MEMS device 10 could be an accelerometer, rate sensor, actuator, pressure sensor etc. Signal lines 30, a portion of which may be formed in the device wafer 20, electrically connect the MEMS device 10 to a microprocessor and/or to other circuitry (not shown). A cap wafer 40 made of silicon or glass is bonded to the device wafer 20 using a sealing glass composition, which is melted and re-solidified to form a hermetic glass seal 50 between the cap wafer 40 and the device wafer 20. The cap wafer 40, the hermetic glass seal 50 and the device wafer 20 thus cooperate to define a package comprising a cavity 60 within which the MEMS device 10 is enclosed and protected.

By their very nature of operation, MEMS devices must be free to move to some degree. Thus, the seal between the device wafer and the cap wafer must prevent dust, moisture and other foreign matter that could interfere with the function of the MEMS device from entering the cavity. Some MEMS devices, such as pressure sensors, for example, require that the cavity be completely evacuated and hermetically sealed. Some MEMS devices, such as motion sensors and accelerometers with resonating micromachined components for example, operate more effectively in a vacuum. And some MEMS devices need a gas back-filled to create a certain atmosphere. A hermetical seal between the cap wafer and the device wafer also ensures that moisture is excluded from the cavity, which could lead to the formation of ice crystals at low temperatures and/or otherwise impede the operation of the MEMS device.

Sealing glass compositions used in MEMS device fabrication are typically applied using screen printing techniques, in which the sealing glass composition is deposited in the form of a paste that contains a particulate glass frit material, a thixotropic binder, and a solvent for the binder. The proportions of glass frit, binder and solvent are adjusted to allow screen printing of a controlled volume of the paste on a designated bonding surface of one of the wafers, typically on the cap wafer. After drying, burning out the binder (BBO) and pre-glazing, which removes all of the organic components from the glass frit bonding paste, the cap and device wafers are aligned and then mated so that the glass frit particles contact complimentary bonding surfaces. The wafers are then incrementally heated to remelt, flow and impart wetting of the wafer surfaces by the glass frit so that upon cooling, the glass frit material re-solidifies to form a substantially homogeneous glass bond line between the wafers.

Because the glass frit particles in glass frit bonding pastes are dispersed in a binder and solvent system, the glass frit particles have a tendency to flow out (i.e., spread) somewhat after they are screen printed and until the solvent is removed. For example, a screen printed line of glass frit bonding paste having an initial line width of about 160 microns will typically spread out to a width of about 200 microns before the solvent is removed from the paste. It would be advantageous if the initial line width could be maintained and if the drying step could be eliminated.

BRIEF SUMMARY OF THE INVENTION

In view of the foregoing, the present invention is directed to hot-melt sealing glass compositions and methods of making and using the same. Hot-melt sealing glass compositions according to the invention comprise one or more glass frits dispersed in a polymeric binder system. The polymeric binder system is a solid at room temperature (herein presently defined as being about 22.5° C.), but melts at a temperature of from about 35° C. to about 90° C., thereby forming a flowable liquid dispersion that can be applied to a substrate (e.g., a cap wafer and/or a device wafer) by screen printing. Hot-melt sealing glass compositions according to the invention rapidly re-solidify and adhere to the substrate after being deposited by screen printing. Thus, they do not tend to spread out as much as conventional solvent-based glass fit bonding pastes after screen printing. And, because hot-melt sealing glass compositions according to the invention are not solvent-based systems, they do not need to be force dried after deposition. The re-solidified screen printed sealing glass pattern can withstand rigorous part handling without detaching from the substrate.

As noted above, the hot-melt sealing glass compositions according to the invention comprise one or more glass frits, which are dispersed in a polymeric binder system. Preferably, the least amount of polymeric binder system necessary to obtain adequate flow in the liquid dispersion state is used. In one embodiment of the invention, hot-melt sealing glass compositions according to the invention comprise about 85% by weight of one or more glass fits and about 15% by weight of the polymeric binder system.

The glass frit or combination of glass frits in the hot-melt sealing glass compositions according to the invention melt and flow at relatively low firing temperatures (e.g., 500° C. or less, preferably 480° C. or less, more preferably 450° C. or less). In preferred low-temperature firing regimes, the hot-melt sealing glass composition of the invention is free of intentionally added $SiO_2$ and/or free of intentionally added $Al_2O_3$. Preferably, the polymeric binder system completely burns out below the glass transition temperature of the glass frit or combination of glass frits. It is envisioned that the glass component may include combinations of two or more glass frits disclosed herein. A polymeric binder system comprising a major amount of a fatty alcohol that is a waxy solid at room temperature and minor amounts of one or more polyacrylate polymers is presently preferred.

An embodiment of the invention is a screen-printable hot-melt sealing glass composition comprising:

from about 50% by weight to about 95% by weight of a glass component comprising at one or more glass frits, and from about 5% by weight to about 50% by weight of a polymeric binder system that is a solid at 22.5° C. but which melts at a temperature within the range of from about 35° C. to about 90° C., wherein the polymeric binder system is capable of complete burn-out at a temperature below about 450° C., and wherein the glass component is capable of melting and flowing at a temperature below about 500° C.

Another embodiment of the invention is a method of bonding a cap wafer to a device wafer so as to hermetically seal and isolate a MEMS device in a cavity defined therebetween, the method comprising:

providing a hot-melt sealing glass composition comprising:

from about 50% by weight to about 95% by weight of a glass component comprising one or more glass frits, and from about 5% by weight to about 50% by weight of a polymeric binder system that is a solid at 22.5° C. but which melts at a temperature within the range of from about 35° C. to about 90° C., wherein the polymeric binder system is capable of complete burn-out at a temperature below about 450° C., and wherein the glass component is capable of melting and flowing at a temperature below about 500° C.

heating the hot-melt sealing glass composition above the melting point of the polymeric binder system to form a molten paste;

depositing the molten paste onto the cap wafer and/or the device wafer by screen printing;

allowing the deposited molten paste to re-solidify;

positioning the cap wafer and device wafer in relation to each other such that the re-solidified hot-melt sealing glass composition is positioned therebetween; and heating the cap wafer and device wafer to a temperature above the melting point of the glass component to form a hermetic seal between the cap wafer and device wafer that isolates the MEMS device in the cavity defined therebetween.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWINGS

FIG. 1 is a schematic cross-section view of a MEMS device formed on a device wafer and covered by a cap wafer.

DETAILED DESCRIPTION OF THE INVENTION

The hot-melt sealing glass composition according to the invention comprises one or more glass frits dispersed in a polymeric binder system. The one or more glass frits are preferably low-melting glass frits such as those glass frits which are conventionally used in sealing glass applications. The loading of the one or more glass frits is preferably as high as possible while still being able to apply the material using conventional screen printing techniques. Loadings of 50% to about 95% by weight are typically achievable.

The particles of the one or more glass frits must be small in order to be applied using screen printing technology. Average particle sizes of about 3 to about 10 microns, and more preferably about 5 microns, are preferred. It will be appreciated that particle sizes can be adjusted, as necessary, to facilitate specific screen-printing demands.

When the hot-melt sealing glass composition is used for sealing a cap wafer to a device wafer during the fabrication of a MEMS device, the glass frit or the combination of two or more glass fits preferably has the following cumulative composition by weight: from about 50% to about 96% PbO+ZnO, from about 1% to about 18% $B_2O_3$, from about 2% to about 15% $SiO_2$, from about 1% to about 10% $Al_2O_3$. Additionally, up to about 5% MgO+BaO and/or up to about 10% $TiO_2$+$Nb_2O_5$+$ZrO_2$ may optionally be included therewith. However, it will be appreciated that the composition of the glass composition can be varied, as needed, to meet the particular requirements of the sealing operation. Higher melting point glass frits can be used in higher temperature applications.

The one or more glass fits can be, but need not be, crystallizing glass frits, which crystallize either before or during firing. One or more glass fits can be of the lead bismuth borate glass type, comprising by weight from about 70% to about 96% PbO+$Bi_2O_3$, from about 3% to about 30% $B_2O_3$ and from about 1% to about 5% $SiO_2$.

In another embodiment, the one or more glass fits can be lead-free and cadmium-free, such as bismuth glasses comprising by weight from about 50% to about 96% $Bi_2O_3$+ZnO, and from about 3% to about 18% $B_2O_3$. A preferred variation of this embodiment also includes from about 1% to about 15% $SiO_2$.

Alternatively, lead-free and cadmium free glasses can be of the alkali-tin-zinc-phosphate type, and can comprise by weight from about 20% to about 55% SnO, from about 25% to about 37% ZnO, from about 10% to about 45% $P_2O_5$ and from about 0.5% to about 15% $Li_2O$+$Na_2O$+$K_2O$+$Rb_2O$.

In addition to the glass frits, sealing glass compositions of the present invention can contain one or more fillers and/or expansion modifiers. Examples of such fillers include cordierite ($2MgO.2Al_2O_3.5SiO_2$), lead titanate ($PbO.TiO_2$); amorphous silica, lead niobate, lead titanium niobate, beta eucryptite, zirconium phosphate, magnesium pyrophosphate.

The one or more glass frits and any optional fillers are dispersed in a polymeric binder system that exists as a waxy solid at room temperature (~22.5° C.), but which melts at a temperature of less than about 70° C. The composition of the polymeric binder system is not per se critical, and a variety of polymeric binder systems can be used.

In some applications, however, it is important that the polymeric binder system completely burn out a relatively low temperature, less than 450° C., preferably less than 350° C. This is particularly important during the fabrication of MEMS devices. Ideally, the polymeric binder system should completely burn out before the one or more glass frits reach their glass transition temperature (Tg). In practice, some of the binder system may still be in the process of burning out as the one or more glass fits reach their glass transition temperature (Tg).

A polymeric binder system suitable for use in sealing cap wafers to device wafers in MEMS device fabrication comprises at least one $C_{14}$ or higher linear primary alcohol. n-Cetyl alcohol is particularly preferred. The polymeric binder system also preferably further comprises acrylic polymers. The presently most preferred acrylic polymers for use in the invention are iso-butyl methacrylate polymers. Optional components can be added to the polymeric binder system as needed. Cellulose-ethers are not preferred for use in the invention inasmuch they tend not to burn out at the relatively low processing temperatures used in MEMS device fabrication.

The hot-melt sealing glass composition according to the invention is preferably formed by mixing the components of the polymeric binder system together at a temperature slightly above the melting point of the fatty alcohol. The one or more glass frits are added to the molten polymeric binder system under mixing conditions and then the paste is passed through a three roll mill heated to a temperature above about 70° C. to ensure that there are no large particles or agglomerations.

The present invention also provides a method of bonding a cap wafer to a device wafer during MEMS device fabrication. The method comprises heating a hot-melt sealing glass composition according to the invention to a temperature above the melting point of the polymeric binder system but below the temperature at which the polymeric binder system begins to substantially volatilize; applying the hot-melt sealing glass composition to a cap wafer and/or a device wafer by screen printing, pad printing, extrusion, dispensing, or any other conventional application method; positioning the cap wafer on the device wafer to encapsulate the MEMS device within a cavity formed between the cap wafer and the device wafer; and firing the MEMS device assembly to completely burn out all organic material in the hot-melt sealing glass composition and to melt the one or more glass frits sufficiently to form a hermetic seal between the cap wafer and the device wafer. Silicon is conventionally used for device wafers, but other semiconductor materials such as GaAs can also be used. Similarly, cap wafers can be made of silicon, other semiconductor materials such as GaAs, or of transparent glass materials such as soda-lime silica glass. Firing temperatures are typically chosen in view of the components used in the MEMS device. Firing temperatures should be high enough to completely burn out the organic material in the hot-melt sealing glass composition and to fuse the one or more glass frits between the cap wafer and the device wafer.

Hot-melt sealing glass compositions according to the invention are particularly useful in the fabrication of MEMS devices. Unlike conventional frit bonding pastes, which are solvent-based liquid dispersions at room temperature, hot-melt sealing glass compositions according to the present invention are waxy solids at room temperature, which simplifies handling and storage. The polymeric binder system melts into a flowable liquid state at a moderately low temperature thereby allowing for the rapid application of the molten hot-melt sealing glass composition to substrates using screen printing, pad printing, extrusion, or other conventional application methods and equipment. The viscosity of the molten hot-melt sealing glass composition can be directly controlled by adjusting the temperature (e.g., to lower the viscosity one needs merely to raise the temperature).

Hot-melt sealing glass compositions according to the invention provide a substantial increase in the rate of MEMS device production. The molten hot-melt sealing glass composition rapidly solidifies after application to the cap wafer and/or device wafer substrate and thus requires no subsequent drying step. The solidified pattern stands up to rigorous part handling without smudging or moving. In fact, other manufacturing process steps can be carried out within seconds after the molten hot-melt sealing glass composition has been deposited on the substrate. This provides a substantial advantage over the use of conventional solvent-based frit bonding pastes, which are liquid dispersions at room temperature and which must be forced dried in ovens before additional processing can be completed. The elimination of the need for drying thus increases component production speed and further reduces component loss due to breakage from handling.

Another advantage of the hot-melt sealing glass composition according to the invention is that it does not release volatile organic compounds during component fabrication. The components of the polymeric binder system are non-hazardous and do not evaporate when heated at the preferred application temperatures. Preferably, the organic materials used in the hot-melt sealing glass composition according to the invention do not evaporate or volatilize until they are subjected to firing conditions, at which point the organic materials can be completely combusted into non-hazardous products. The absence of volatile compounds in the composition increase the shelf life and stability of the composition as compared to conventional solvent-based glass frit bonding pastes, which are liquid dispersions at room temperature.

As noted above, the hot-melt sealing glass composition according to the invention is particularly well-suited for application to substrates using well-known screen printing techniques among other techniques. Although conventional screen printing equipment can be used, it is preferable for the screen, stage, and squeegee to be heated. It will be appreciated that the particular heating screen, stage, and squeegee heating temperatures will be dictated by the melt temperature of the hot-melt sealing glass composition, the desired viscosity of the molten material; and the surface cosmetics to be achieved in the printed pattern. For example, when a hot-melt sealing glass composition is used that melts within the range of from about 35° C. to about 90° C., the screen temperature will preferably be maintained within the range of from about 40° C. to about 90° C., the stage temperature is maintained within the range of from about 30° C. to about 65° C., and the squeegee temperature is maintained up to about 65° C. By optimizing the temperature parameters for the application equipment, the hot-melt sealing glass composition can be used to screen print, pad print, extrude, or dispense patterns having excellent print cosmetics.

The following examples are intended only to illustrate the invention and should not be construed as imposing limitations upon the claims.

EXAMPLE 1

A glass frit ("Component 1") and a crystallized cordierite glass ceramic filler ("Component 2"), having the compositions shown in Table 1 below in weight percent, were each prepared using conventional glass melting techniques:

TABLE 1

|  | Component 1 | Component 2 |
| --- | --- | --- |
| PbO | 84.0 | — |
| $SiO_2$ | 1.2 | 51.1 |
| $Al_2O_3$ | 0.8 | 34.0 |
| MgO | — | 12.9 |
| $B_2O_3$ | 11.0 | — |
| ZnO | 3.0 | — |
| BaO | — | 2.0 |

Components 1 and 2 were milled to a fineness of $D_{50}<10$ microns.

EXAMPLE 2

Hot-melt Sealing Glass Composition A ("Glass A") was formed by mixing the various components shown in weight percent in Table 2 below in a jacketed high speed mixer at 70° C. for 1 hour:

TABLE 2

|  | Glass A |
| --- | --- |
| Component 1 | 75.6 |
| Component 2 | 9.3 |
| ALFOL ™ 16 | 12.1 |
| ELVACITE ™ 2045 | 1.5 |
| ACRYLOID ™ B-67 | 1.5 |

ALFOL™ 16 is a 1-hexadecanol (n-cetyl alcohol) product that is commercially available from Sasol Olefins & Surfactants GmbH (Germany). ELVACITE™ 2045 is a high molecular weight iso-butyl methacrylate polymer that is commercially available from Lucite International Ltd (United Kingdom). And, ACRYLOID™ B-67 is an isobutyl methacrylate polymer that is commercially available from Rohm and Haas (United States).

The ALFOL™ 16, ELVACITE™ 2045 and ACRYLOID™ B-67 were charged to the heated mixing chamber and well-mixed before Components 1 and 2 were added. After mixing, the resulting molten dispersion or paste was passed through a three roll mill three times and then allowed to cool to room temperature (~22.5° C.).

EXAMPLE 3

Hot-melt Sealing Glass Composition A formed in Example 2 above was heated to a temperature of 65° C. and then screen printed onto a glass cap wafer using a 325 mesh screen to form a 175 microns wide sealing line. The composition rapidly solidified on the cap wafer within a few seconds after the screen was removed. The screen printed cap wafer was then heated in an air atmosphere from room temperature to 295° C. at a rate of 3° C./min, held at 295° C. for about 15 to 45 minutes to burn off organics, and then heated at a rate of about 3° C./min to 410° C. and held at 410° C. for 5 minutes and then furnace cooled to room temperature. After this pre glazing step, the cap wafer was then placed over the device wafer in a wafer bonder after evacuating the chamber at about 200° C. and back filling with a desired gas. Then the entire assembly was heated at about 20 to 30° C./min to a peak firing temperature of about 450° C. for about 15 minutes, and the entire assembly was furnace cooled to room temperature in the wafer bonder. A bonding force appropriate to the wafer size was applied on the cap wafer during the bonding process to force the sealing glass to wet and bond device wafer to the cap wafer. During the heating cycle, the organic components of the composition completely burned out before the glass frits melted and flowed. The cap wafer was hermetically sealed to the device substrate.

Compositional percentages are by weight. Certain embodiments of the invention are envisioned where at least some percentages, temperatures, times, and ranges of other values are preceded by the modifier "about." Numerical ranges including "about" are also intended to provide support for the range without "about." "Comprising" is intended to provide support for "consisting of" and "consisting essentially of." Numerical ranges of oxides or other ingredients that are bounded by zero on the lower end (for example, 0-10 wt % $TiO_2$) are intended to provide support for the concept "up to [the upper limit]," for example "up to 10 wt % $TiO_2$" as well as a positive recitation that the ingredient in question is present in an amount that does not exceed the upper limit; the phrases in this sentence are interchangeable. A recitation such as "up to 10 wt % $TiO_2$" is intended to provide support for "0-10 wt % $TiO_2$" as well as for "comprises $TiO_2$, provided the amount does not exceed 10 wt %." A recitation such as "70-96 wt % PbO+$Bi_2O_3$" means that any or all of PbO and/or $Bi_2O_3$ may be present in an amount of 70-96 wt %.

Additional advantages and modifications will readily occur to persons having skill in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. A method of bonding a cap wafer to a device wafer so as to hermetically seal and isolate a MEMS device in a cavity defined therebetween, the method comprising:
   providing a hot-melt sealing glass composition comprising:
      from about 50% by weight to about 95% by weight of a glass component comprising one or more glass frits, and
      from about 5% by weight to about 50% by weight of a polymeric binder system that is a solid at 22.5° C. but which melts at a temperature within the range of from 35° C. to 90° C.,
      wherein the polymeric binder system is capable of complete burn-out at a temperature below 450° C., and
      wherein the glass component is capable of melting and flowing at a temperature below 500° C.
   heating the hot-melt sealing glass composition above the melting point of the polymeric binder system and below a temperature at which the polymeric binder system begins to substantially volatilize, to form a molten paste;
   depositing the molten paste onto the cap wafer and/or the device wafer by screen printing;
   allowing the deposited molten paste to re-solidify;
   positioning the cap wafer and device wafer in relation to each other such that at least the glass component of the hot-melt sealing glass composition is positioned therebetween; and
   firing the cap wafer and device wafer at a temperature above the melting point of the glass component to form a hermetic seal between the cap wafer and device wafer that isolates the MEMS device in the cavity defined therebetween.

2. The method of claim 1, wherein the glass component comprises:
   (a) from about 50 to about 96 wt % PbO+ZnO,
   (b) from about 1 to about 18 wt % $B_2O_3$,
   (c) from about 2 to about 15 wt % $SiO_2$, and
   (d) from about 1 to about 10 wt % $Al_2O_3$.

3. The method of claim 2, wherein the glass component further comprises at least one of (a) and (b):
   (a) up to about 5 wt % MgO+BaO and
   (b) up to about 10 wt % $TiO_2$+$Nb_2O_5$+$ZrO_2$.

4. The method of claim 1, wherein the glass component comprises:
   (a) from about 70 to about 96 wt % PbO+$Bi_2O_3$,
   (b) from about 3 to about 30 wt % $B_2O_3$, and
   (c) from about 1 to about 5 wt % $SiO_2$.

5. The method of claim 1, wherein the glass component comprises:
   (a) from about 50 to about 96 wt % $Bi_2O_3$+ZnO and
   (b) from about 1 to about 30 wt % $B_2O_3$.

6. The method of claim 1, wherein the glass component is lead-free and cadmium-free, and comprises:
   (a) from about 20 to about 55 wt % SnO,
   (b) from about 25 to about 37 wt % ZnO,
   (c) from about 10 to about 45 wt % $P_2O_5$, and
   (d) from about 0.5 to about 15 wt % $Li_2O$+$Na_2O$+$K_2O$+$Rb_2O$.

7. The method of claim 1, wherein the polymeric binder comprises a C14 or higher linear primary alcohol.

8. The method of claim 1, wherein the polymeric binder comprises n-cetyl alcohol.

9. The method of claim 1, wherein the polymeric binder further comprises acrylic polymers.

10. The method of claim 9, wherein the acrylic polymers include isobutyl methacrylate polymers.

11. The method of claim 1, wherein the average particle size of the one or more glass frits in the glass component is from 3 microns to 10 microns.

12. The method of claim 1, wherein the hot melt sealing glass composition does not contain cellulose-ethers.

13. The method of claim 1, wherein the device wafer is formed of silicon or GaAs.

14. The method of claim 1, wherein the cap wafer is formed of silicon, GaAs or soda-lime silica glass.

15. The method of claim 1, wherein the hot melt sealing glass composition does not release volatile organic compounds during the heating, depositing, allowing and positioning steps.

16. The method of claim 1, wherein organic compounds present in the hot melt sealing composition do not evaporate or volatilize until the firing step.

17. The method of claim 1, further comprising the step of subjecting the device wafer to further processing and handling between the allowing step and the positioning step.

18. The method of claim 1, further comprising, between the allowing step and the positioning step, a pre glazing step in which the device wafer and/or the cap wafer on which the hot melt sealing composition has re-solidified is heated to a pre glazing temperature and then allowed to cool.

19. The method of claim 18, further comprising, between the positioning step and the firing step, a back filling step in which the cavity between cap wafer and the device wafer is filled with a desired gas.

* * * * *